United States Patent
Schaaf

(10) Patent No.: US 9,360,537 B2
(45) Date of Patent: Jun. 7, 2016

(54) METHOD FOR CONTACTLESS MEASUREMENT OF A RELATIVE POSITION BY MEANS OF A HALL SENSOR

(71) Applicant: Tyco Electronics AMP GmbH, Bensheim (DE)

(72) Inventor: Oliver Schaaf, Lustadt (DE)

(73) Assignee: TE Connectivity Germany GmbH, Bensheim (DE)

( * ) Notice: Subject to any disclaimer, the term of this patent is extended or adjusted under 35 U.S.C. 154(b) by 83 days.

(21) Appl. No.: 14/348,029

(22) PCT Filed: Sep. 25, 2012

(86) PCT No.: PCT/EP2012/068842
§ 371 (c)(1),
(2) Date: Mar. 27, 2014

(87) PCT Pub. No.: WO2013/045430
PCT Pub. Date: Apr. 4, 2013

(65) Prior Publication Data
US 2014/0239942 A1  Aug. 28, 2014

(30) Foreign Application Priority Data

Sep. 29, 2011  (DE) .......................... 10 2011 115 302

(51) Int. Cl.
*G01B 7/00*  (2006.01)
*G01R 33/025*  (2006.01)
(Continued)

(52) U.S. Cl.
CPC  *G01R 33/07* (2013.01); *G01B 7/14* (2013.01); *G01D 5/145* (2013.01); *G01D 5/2448* (2013.01)

(58) Field of Classification Search
CPC ....... G01D 5/145; G01D 5/2448; G01B 7/14; G01R 33/07

USPC ........ 324/51, 55, 200, 207.12, 252, 260, 262, 324/207.2, 207.21, 207.26, 251
See application file for complete search history.

(56) References Cited

U.S. PATENT DOCUMENTS

| 4,737,710 A | 4/1988 | Van Antwerp et al. |
| 6,731,108 B2 | 5/2004 | Zalunardo et al. |

(Continued)

FOREIGN PATENT DOCUMENTS

| DE | 102004002649 A1 | 8/2005 |
| EP | 0115391 A2 | 8/1984 |

(Continued)

OTHER PUBLICATIONS

EP 2159546 Machine Translation; Mar. 3, 2010.*

(Continued)

*Primary Examiner* — Huy Q Phan
*Assistant Examiner* — Raul Rios Russo
(74) *Attorney, Agent, or Firm* — Faegre Baker Daniels LLP

(57) ABSTRACT

The present invention relates to a method for contactless measurement of a relative position of a magnetic field source, which produces a magnetic field and a magnetic field sensor in relation to each other. The present invention further relates to a corresponding displacement sensor. According to the present invention, the magnetic field sensor detects at least two spatial components (Bz, By) of the magnetic field and a position signal is produced from the measured components. The method comprises the following steps of calculating the position signal based on a quotient of the two magnetic field components; and correcting, before the quotient is calculated, the magnetic field component, which extends in a movement direction between the magnetic field source and the magnetic field sensor.

13 Claims, 10 Drawing Sheets

(51) Int. Cl.
  *G01R 33/07* (2006.01)
  *G01D 5/14* (2006.01)
  *G01D 5/244* (2006.01)
  *G01B 7/14* (2006.01)

(56) References Cited

U.S. PATENT DOCUMENTS

| | | | | |
|---|---|---|---|---|
| 2002/0167306 A1* | 11/2002 | Zalunardo | ............... | G01D 5/145 324/207.2 |
| 2008/0134727 A1* | 6/2008 | May | ............... | G01D 5/145 68/12.02 |
| 2009/0160433 A1* | 6/2009 | Oberhoffner | ............... | G01B 7/003 324/207.13 |
| 2010/0026291 A1* | 2/2010 | Schmid | ............... | B60L 13/06 324/260 |
| 2011/0227567 A1 | 9/2011 | Reidmueller et al. | | |
| 2015/0081246 A1* | 3/2015 | Schaaf | ............... | G01D 5/145 702/150 |

FOREIGN PATENT DOCUMENTS

| | | |
|---|---|---|
| EP | 1243897 A1 | 9/2002 |
| EP | 2159546 A2 | 3/2010 |
| WO | WO 2007/092402 A2 | 8/2007 |

OTHER PUBLICATIONS

DE 102004002649 Machine Translation; Aug. 11, 2005.*
International Preliminary Report on Patentability issued by The International Bureau of WIPO, Geneva, Switzerland, dated Apr. 1, 2014, for International Application No. PCT/EP2012/068842; 7 pages.
International Search Report and Written Opinion issued by the European Patent Office, dated Dec. 10, 2012, for International Application No. PCT/EP2012/068842; 11 pages.
Search Report issued by the German Patent and Trademark Office, dated Aug. 17, 2012, for Priority Application No. DE 10 2011 115 302.4; 12 pages.

* cited by examiner

METHOD FOR CONTACTLESS MEASUREMENT OF A RELATIVE POSITION BY MEANS OF A HALL SENSOR

BACKGROUND

The present invention relates to a method for contactless measurement of a relative position of a magnetic field source which produces a magnetic field and a magnetic field sensor in relation to each other. Furthermore, the present invention also relates to a corresponding displacement sensor.

In particular, linear movements are intended to be detected and evaluated by means of the method according to the invention in a contactless manner by means of magnetic interaction between one or more permanent magnets and a magnetic sensor based on the Hall effect.

The measurement of linear movements is used, for example, for controlling machine tools, in pneumatics, in automation technology and robotics as well as in the automotive sector. Contactless detection of movements affords inter alia the advantage of freedom from wear. Among the contactless measuring methods, optical and magnetic methods are most widespread. Whereas the optical methods ensure a very high level of precision owing to the short wavelength of the light, magnetic methods are far less sensitive with respect to contamination and damage, in particular in that magnets and sensor components can be completely enclosed in a non-magnetic hermetic casing.

Displacement sensor systems in which the position of a displaceable permanent magnet is established by means of a two-dimensional or three-dimensional Hall sensor are marketed by various manufacturers.

In order to detect the relative linear movements at a location, two magnetic field components which are perpendicular to each other are measured and their quotient is evaluated in order to determine the position. This method has the advantage that, in regions in which a field component takes up an extreme value and therefore does not detect small displacements, the other field component reacts all the more strongly to displacements so that an approximately identically high level of measurement precision is provided over the entire measurement range.

Furthermore, this principle has the advantage that it is comparatively not very sensitive with respect to a change in the absolute magnetic field strength because proportional numbers between the field components are used to detect the position.

European patent specification EP0979988 B1 discloses measurement methods for contactless magnetic detection of relative linear movements between permanent magnets and electronic sensors. In order to detect the relative linear movements by means of the electronic sensors, two mutually perpendicular field components whose quotient is evaluated to establish the position are detected.

In a second method variant, the known measurement method can also be carried out so that two mutually perpendicular field components whose quotient is evaluated to establish the position are detected at two locations in order to detect the relative linear movements by means of the electronic sensors.

The published European patent application EP2159546 A2 discloses a measurement method for contactless detection of relative linear movements between a sensor arrangement for detecting two mutually perpendicular magnetic field components (R, A) and a permanent magnet. A two-dimensional or three-dimensional Hall sensor is used in place of individual sensors in order to detect different field components. The quasi-linear position measurement line is formed by the function $U=y-e+g$, where y is the functional relationship of the field components and e and g are predeterminable voltage values. In particular, a quasi-linear position measurement line $U=f(y)$ is formed from the output signals of the Hall sensor according to the relationship $y=a+b \cdot R/f(c \cdot R''+d \cdot A'')$, where R is the radial field component, A is the axial field component, U is the measurement voltage and a, b, c, d and n are constant factors.

The published European patent application EP1243897 A1 relates to a magnetic displacement sensor which comprises a magnetic field source and a magnetic field sensor which can be displaced relative to each other along a predetermined path. The magnetic field sensor measures two components of the magnetic field produced by the magnetic field source. A position signal which represents the relative position of the magnetic field sensor and the magnetic field source is then derived from the measured components. The configurations of the displacement sensor shown in this specification are distinguished in that the determination of the position signal contains a division of the two measured components of the magnetic field.

However, those known methods have the disadvantage that the spacing between the permanent magnet and the magnetic sensor constitutes a significant error source in the measurement. It is often very difficult to keep that spacing constant, particularly owing to assembly tolerances, thermally induced material expansion and vibration influences.

FIG. 1 shows an arrangement in which a Hall sensor 100 is fitted so as to be fixed in position in order to contactlessly detect a linear movement and detects the magnetic field of a movable permanent magnet 102. In accordance with the north/south polarisation in the direction of movement of the permanent magnet 102, the magnetic field extending in the direction of movement is referred to below as the magnetic field component Bz and the component extending transversely thereto is referred to as the component By. The angle α, which can be calculated in accordance with the following equation (1) is generally used as the measurement signal.

$$\alpha = \arctan\left(\frac{Bz}{By}\right) \quad (1)$$

As illustrated in FIG. 2, the angle α is dependent in a comparatively linear manner on the position of the permanent magnet 102 in relation to the Hall sensor 100 up to a given threshold value. Usually, the characteristic line currently being measured is further linearised, as illustrated in FIG. 2 by means of the line 104. That linearised line α_lin 104 then forms the characteristic output line of the sensor.

With reference to FIGS. 3 and 4, the dependence of the output signal on the spacing d between the permanent magnet 102 and the sensor 100 is explained in greater detail (see FIG. 1).

In FIG. 3, the groups of lines for the magnetic field components By and Bz are indicated with different spacings b as parameters. The line having the smallest magnetic field in terms of value is the one having the greatest spacing (in this instance, 7 mm), respectively. If the angle is calculated from those field components by means of its dependence on the position of the permanent magnet, the path illustrated in FIG. 4 is obtained. In order to illustrate how great the gradient error is, the characteristic lines are subtracted one from the other and the percentage error is set out. The dependence illustrated in FIG. 5 is produced as a result.

The line 106 represents the error between the lines for a spacing of 7 mm and the line for a spacing of 6.5 mm, whilst the line 108 represents the difference between the angle α for a spacing of 6.5 mm and the angle for a spacing of 5.5 mm. That is to say, a spacing variation of 1 mm results in a deviation of 1.6% and a spacing variation of 1.5 mm results in a deviation of 2.3%.

However, this is not acceptable for very sensitive systems such as, for example, an assisted steering system or a pedal travel measurement in a motor vehicle, so that there is a need for an improved signal processing operation which is less sensitive with respect to an undesirable variation of the spacing between the permanent magnet and the Hall sensor element.

SUMMARY

An object of the present invention is to improve a measurement method and a displacement sensor of the type mentioned so that as linear a measurement signal as possible is produced over as wide a measurement range as possible and is influenced as little as possible by variations in spacing between the magnetic field source and the magnetic field sensor.

This object is achieved by the subject-matter of the independent patent claims. The dependent claims relate to advantageous developments of the method and displacement sensor according to the invention.

The present invention is based on the notion of not using the value for the field component in the movement direction directly in the arc tangent calculation, but instead to expand this term by a correction value. That offset value results in gradient adaptation of lines for the angle α at different spacings d.

Since this is a comparatively simple calculation operation, it is possible to improve the precision of a displacement sensor in accordance with the generic type in an extremely simple manner.

For a better understanding of the present invention, it is explained in greater detail with reference to the embodiments illustrated in the following Figures. Identical components are indicated with identical reference numerals and identical component designations.

Furthermore, individual features or combinations of features from the embodiments shown and described may also constitute independent inventive solutions or solutions according to the invention separately.

DETAILED DESCRIPTION

The invention is intended to be explained in greater detail below initially with reference to FIG. 6 and FIG. 1.

Figure 1:
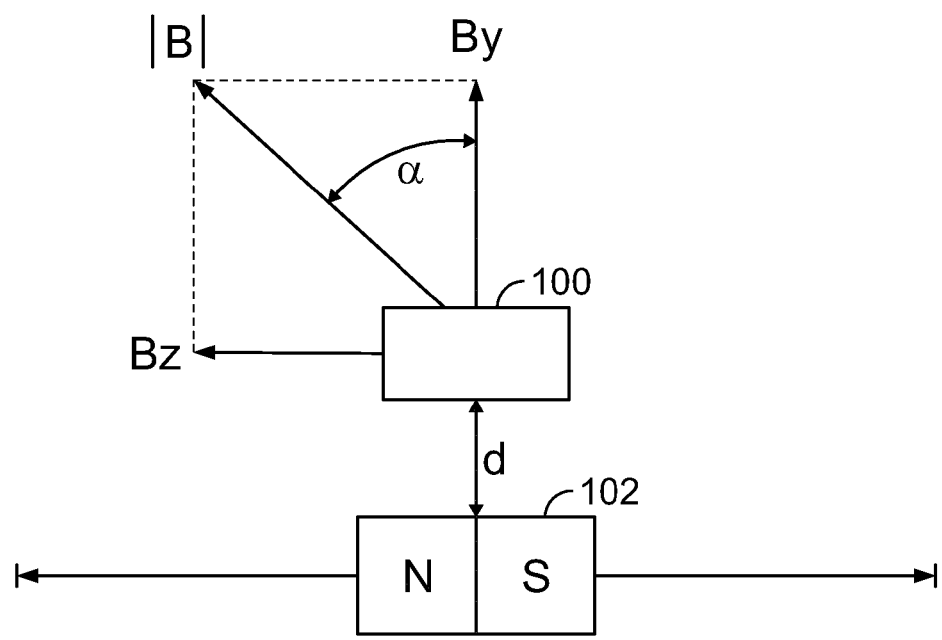
FIG. 1 shows a displacement sensor whose signal can be evaluated according to the present invention.
Figure 2:
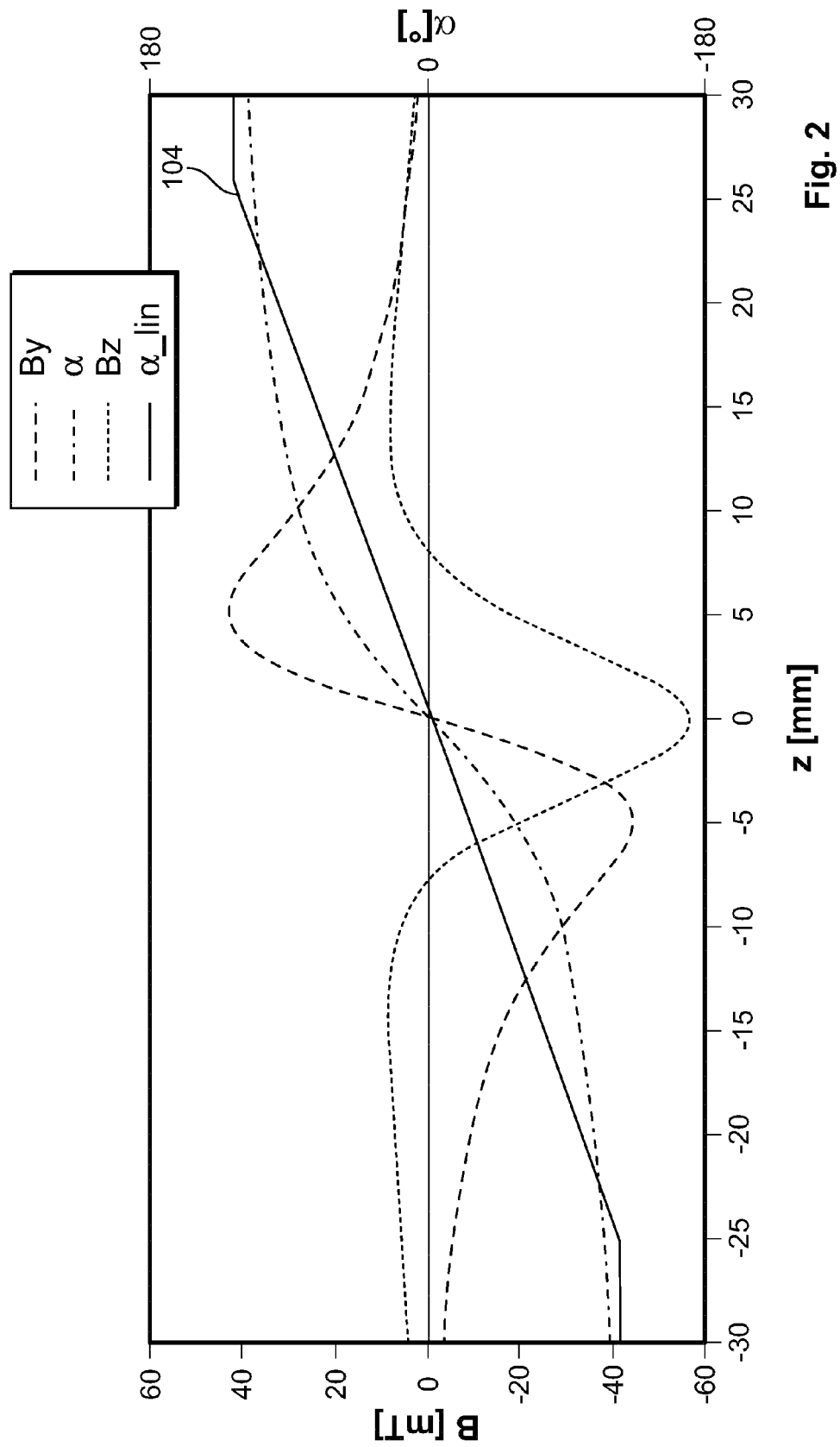
FIG. 2 shows the path of the magnetic field components produced in accordance with the position of the permanent magnet and the non-corrected angle α calculated therefrom.
Figure 3:
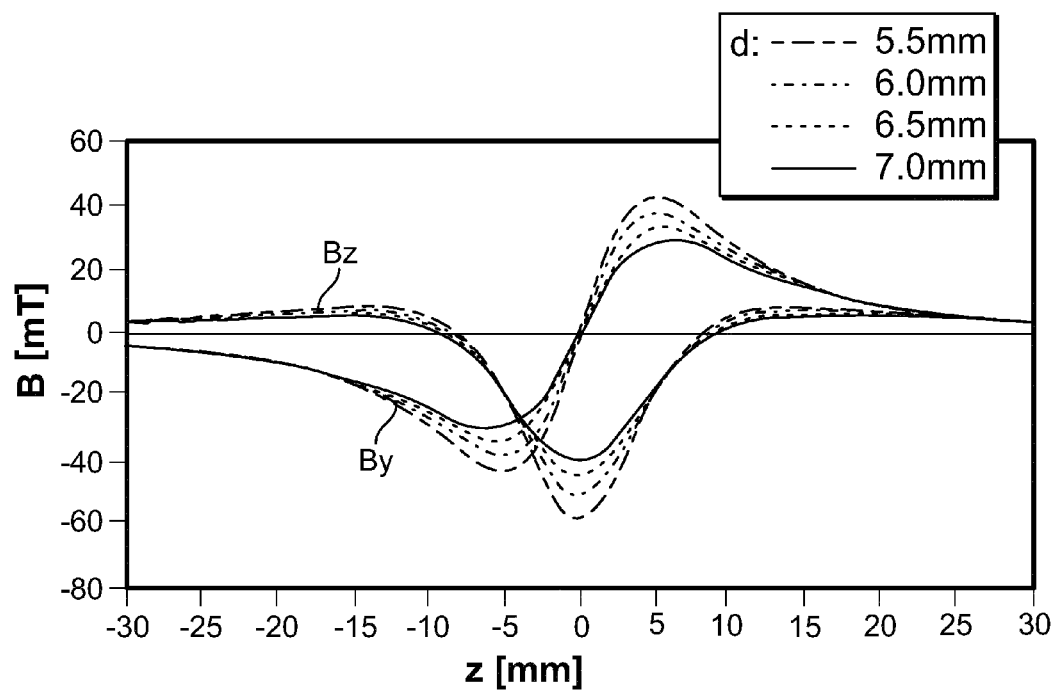
FIG. 3 shows the field components produced by the permanent magnet in the y direction and z direction in accordance with the spacing between the permanent magnet and the magnetic field sensor.
Figure 4:
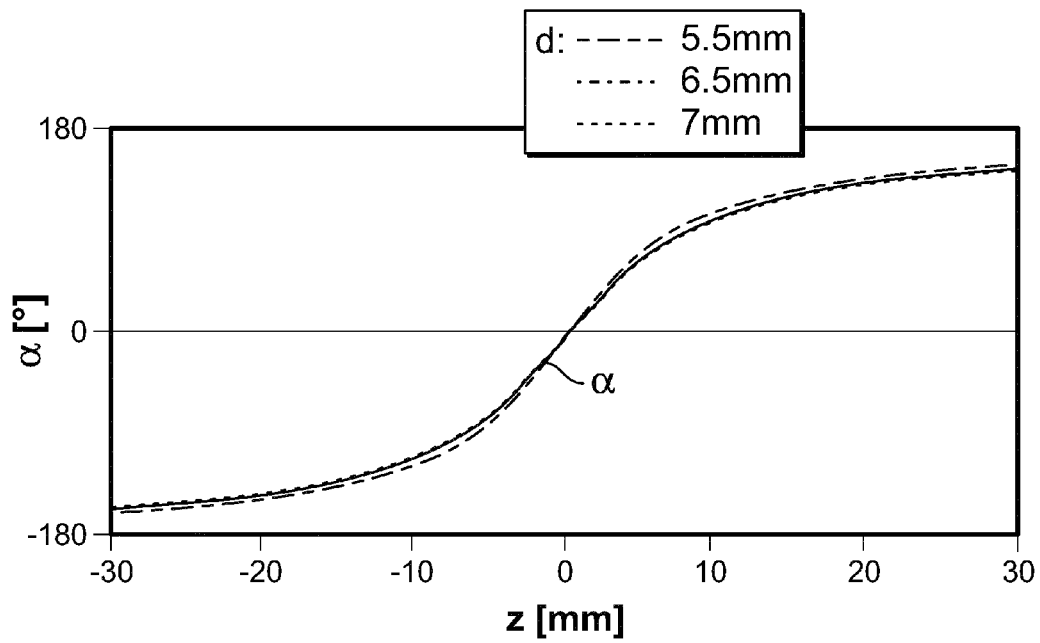
FIG. 4 shows the angle α as a function of the position of the permanent magnet for different spacings d.

A displacement sensor arrangement according to a first embodiment is shown in FIG. 1. A Hall sensor 100 is mounted so as to be fixed in position and a permanent magnet 102 is supported so as to be linearly movable in relation to the Hall sensor 100. The permanent magnet 102 has such a pole configuration that its north/south axis is orientated parallel with the movement direction. In principle, however, it is also possible to use the principles of the present invention for arrangements in which the permanent magnet 102 has such a pole configuration that its north/south axis extends transversely relative to the movement direction. The permanent magnet 102 can be displaced out of the zero position shown in FIG. 1 in two directions by, for example, approximately 25 mm. The Hall sensor 100 detects at least two orthogonal magnetic field components—one which extends along the movement line and one which extends transversely relative thereto. Vector addition of the two components provides the value of the magnetic field |B|. The angle α is defined as the angle which is enclosed by the total magnetic field vector |B| with the line perpendicular to the direction of movement.

As already mentioned, the angle α is calculated from the magnetic field components in or transversely to the movement direction according to equation (1):

$$\alpha = \arctan\left(\frac{Bz}{By}\right) \quad (1)$$

Naturally, it is also possible to transfer the principles according to the invention to other magnetic field sources, for example, electromagnets, and to other magnetic field sensors, such as magnetoresistive sensors or inductive sensors.

Figure 6:
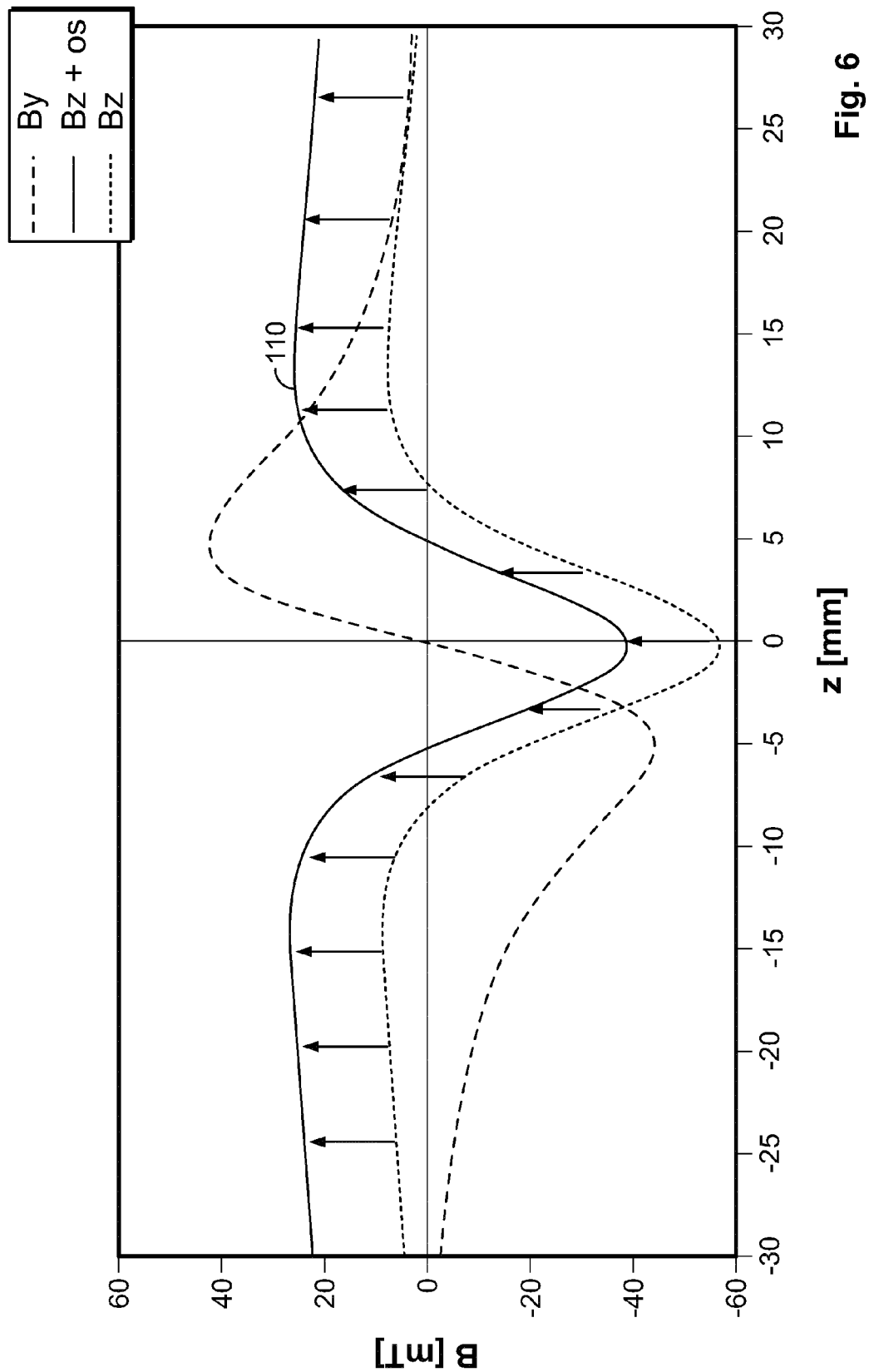
FIG. 6 shows the explanation of the calculation provisions for the correction according to the invention.

FIG. 6 shows the measurement signals which are measured in accordance with the position of the permanent magnet 102 of the magnetic field sensor, in this instance a Hall sensor 100. These are, on the one hand, the values of the magnetic field in the movement direction Bz and, on the other hand, the values of the magnetic field transverse relative to the movement direction By. Naturally, it is also possible to use the values Bx which extend orthogonally to By for the calculation.

According to the invention, the arc tangent of the quotient Bz to By according to equation (1) is not used as the measurement signal but instead the magnetic field component Bz which extends in the movement direction is corrected by means of an offset value. That offset results in a gradient adaptation. The following equation (2) is produced for the calculation of the angle α:

$$\alpha\_OS = \arctan\left(\frac{Bz + OS}{By}\right) \quad (2)$$

The corrected Bz+OS line is designated 110 in FIG. 6.

Figure 7:
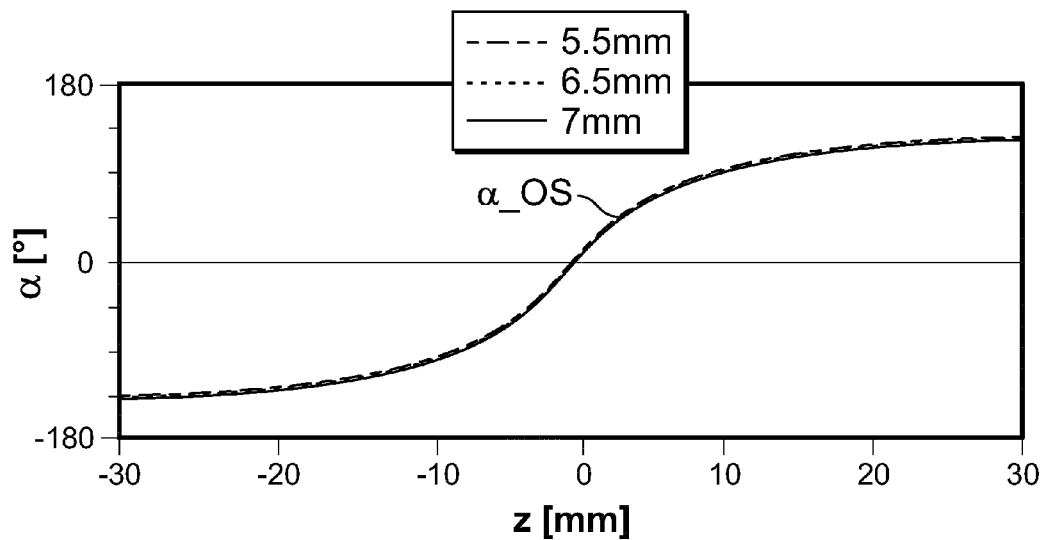
FIG. 7 shows the path of the corrected angle α in accordance with the spacing between the permanent magnet and the magnetic field sensor.

If the line progression of the corrected angle α_OS is now considered in FIG. 7 for different spacings d, it is evident that the progression of the line is substantially less dependent on a variation of the spacing d which is indicated here as a parameter for the group of lines.

This means that, on the one hand, assembly tolerances can be taken up with the solution according to the invention but, on the other hand, influences owing to vibrations can also be prevented.

Figure 8:
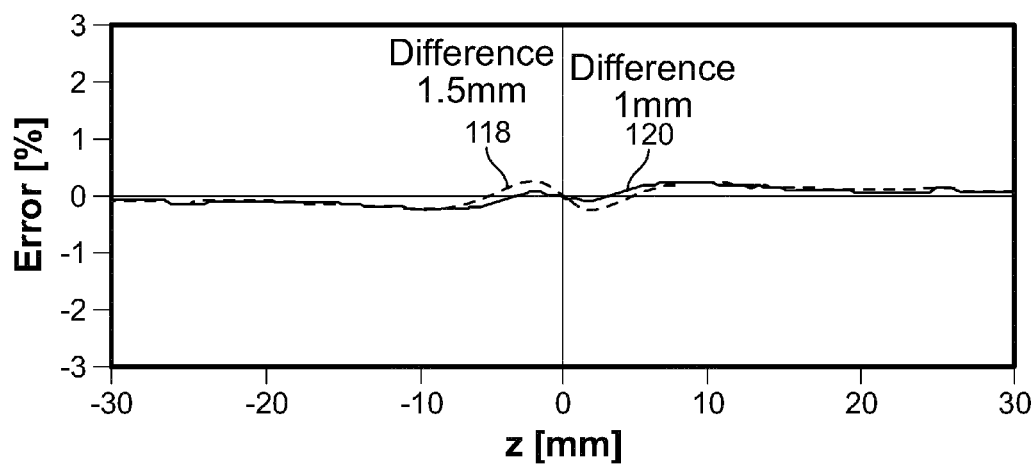
FIG. 8 shows the relative error in accordance with the position for different spacings.
Figure 9:
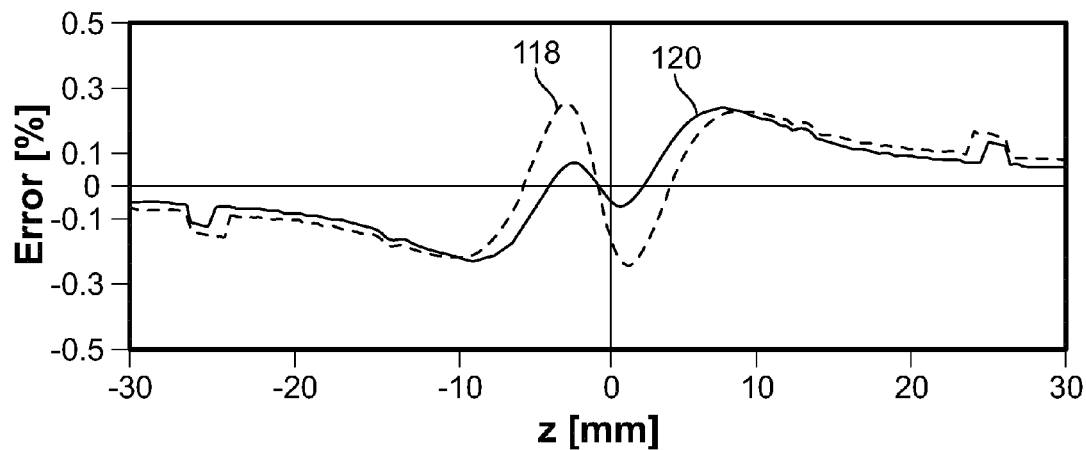
FIG. 9 shows the two lines from FIG. 8 to an enlarged scale.

The lines of FIGS. 8 and 9 show the corresponding relative errors of the angle α_OS for d=7 mm in comparison with d=6.5 mm (the line 118 indicates the relative error of α_OS_7.0 mm-α_OS_6.5 mm) and for d=6.5 mm and d=5.5 mm (the line 120 indicates the relative error of α_OS_6.5 mm-α_OS_5.5 mm) in relation to the higher value in each case.

Figure 5:
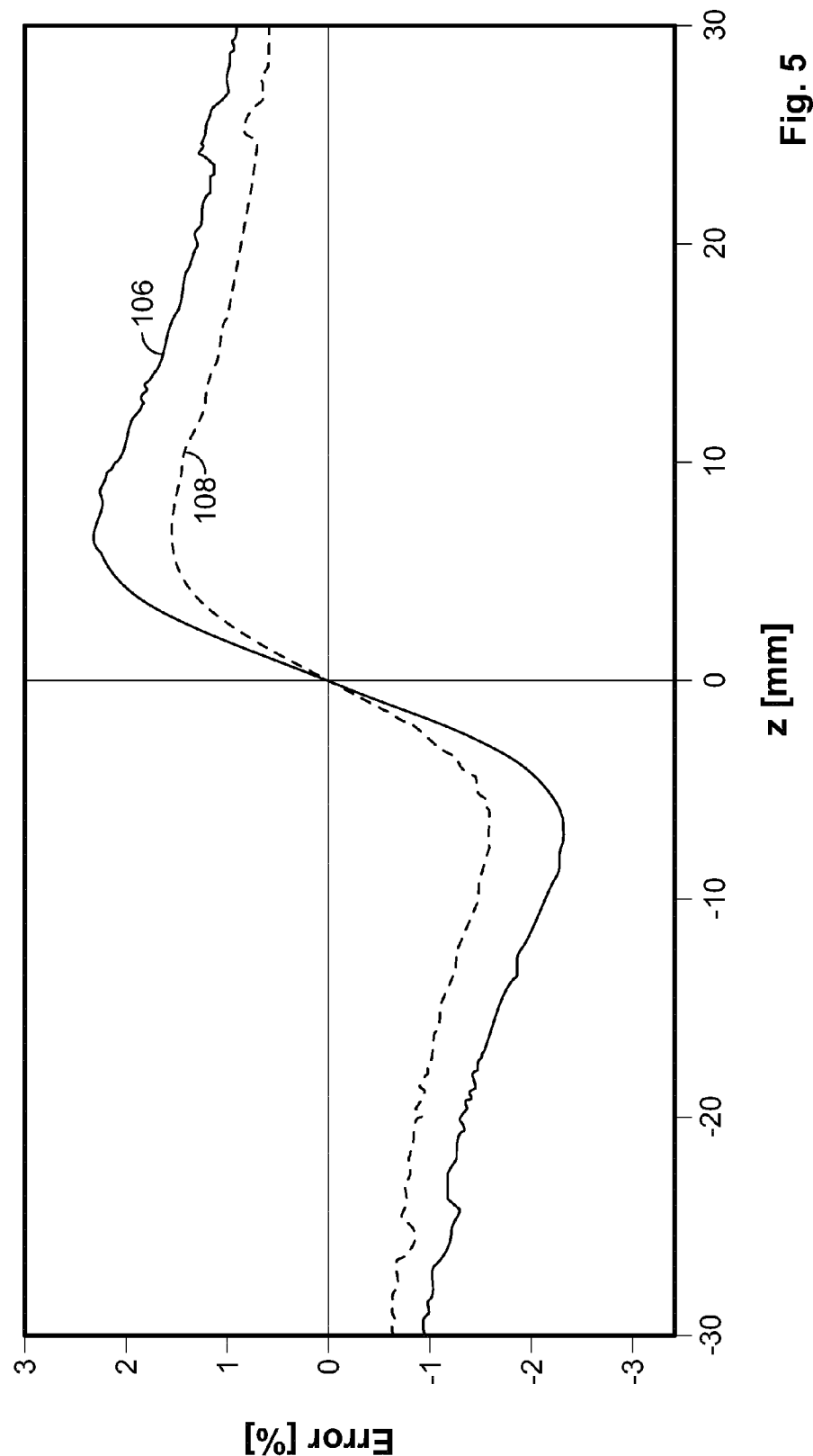
FIG. 5 shows the relative error in accordance with the spacing between the permanent magnet and the magnetic field sensor.

In comparison with the lines of FIG. 5, the influence of the spacing d on the measurement signal is substantially smaller in this instance. It can be seen that a variation in spacing of 1 mm results in a deviation of less than 0.3% and a variation in spacing of 1.5 mm also results in a deviation of less than 0.3%.

Owing to the correction according to the invention, the spacing dependence of the output signal is reduced to approximately ⅛ with respect to the uncorrected evaluation.

The correction value used in FIG. 6 is OS=14.7 mT. The computational establishment of that value is intended to be explained in greater detail below with reference to FIGS. 10 and 11.

Figure 10:
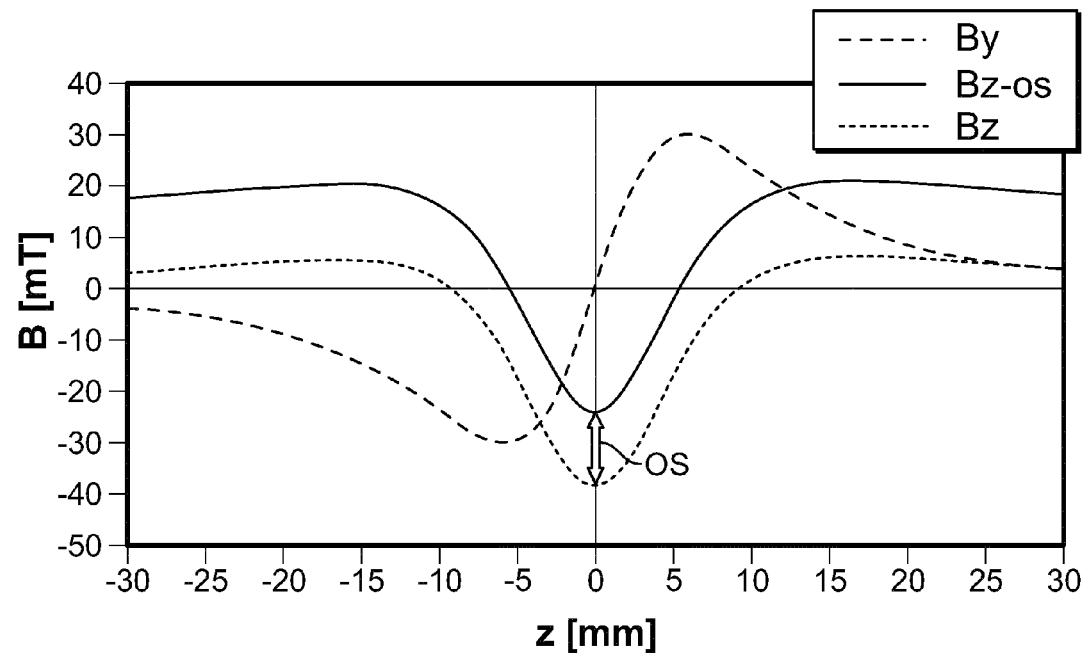
FIG. 10 shows the path of the measured and corrected magnetic field components in accordance with the position.
Figure 11:
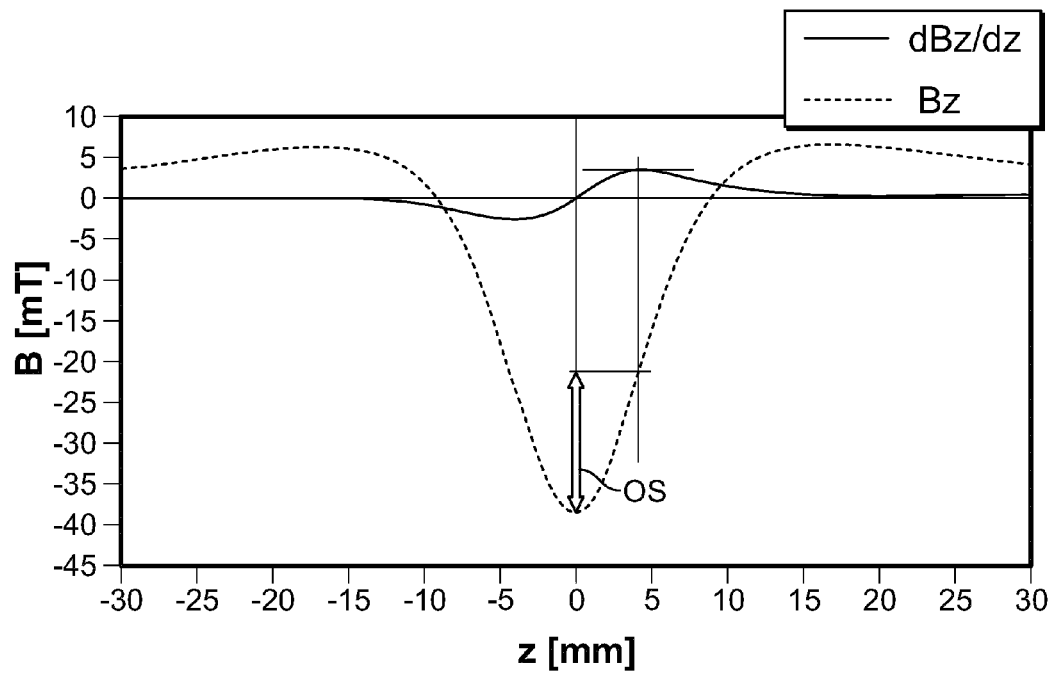
FIG. 11 shows the path of the magnetic field component which extends parallel with the change in position and the first derivative thereof.

In FIG. 10, the paths for the orthogonal magnetic field components By and Bz are indicated, FIG. 11 shows the line Bz in accordance with the position of the permanent magnet 102 and the derivative of the field component along the movement to the position x. It can be seen that the optimum for the term OS is achieved when the point of inflection of Bz is equal to zero, that is to say, when the second derivative is zero or the gradient of the line 112 shown is horizontal.

The difference between the maximum value for Bz and the value at the location $d^2Bz/dz^2=0$ results in an offset value of OS=14.7 mT for the embodiment shown in FIG. 1.

However, that offset value does not necessarily have to be added to the field component in a computational manner but instead may also be produced physically by another auxiliary magnet 114 because a constant factor is always added in the method according to the invention.

Figure 12:
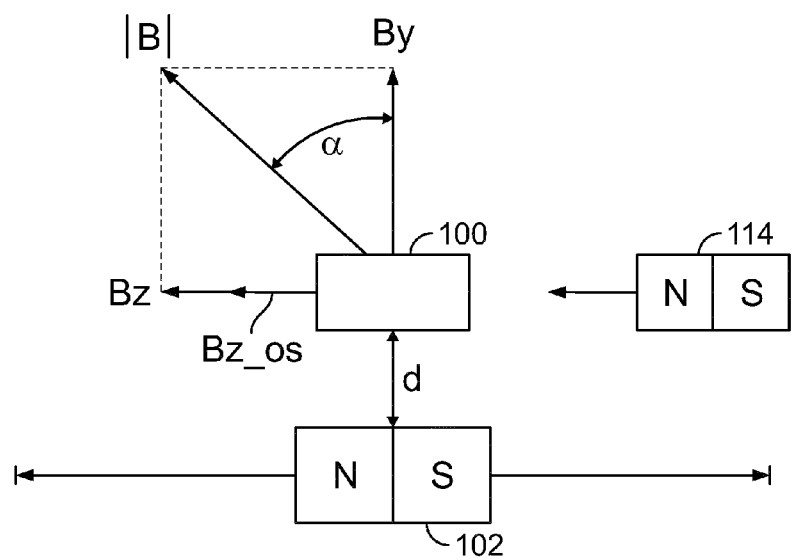
FIG. 12 shows a displacement sensor arrangement according to a second embodiment.
Figure 13:
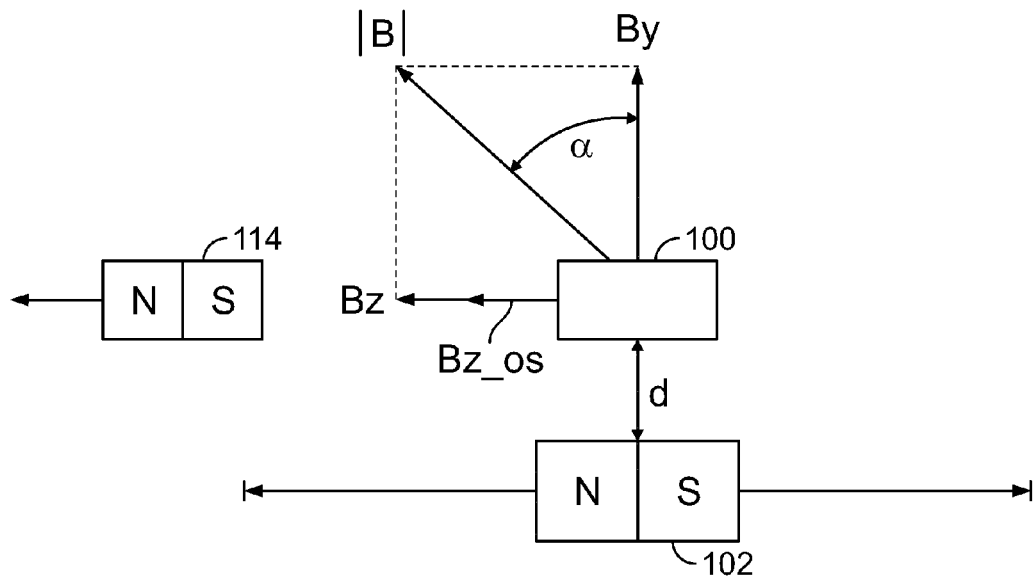
FIG. 13 shows a displacement sensor arrangement according to a third embodiment.

The auxiliary magnet 114 may be arranged in a plane which has the same spacing d from the movable permanent magnet as the Hall sensor 100 (see FIGS. 12 and 13). Owing to the auxiliary magnet 114, a magnetic field component which ensures the necessary correction according to equation (2) is produced in the movement direction Bz_OS.

Figure 14:
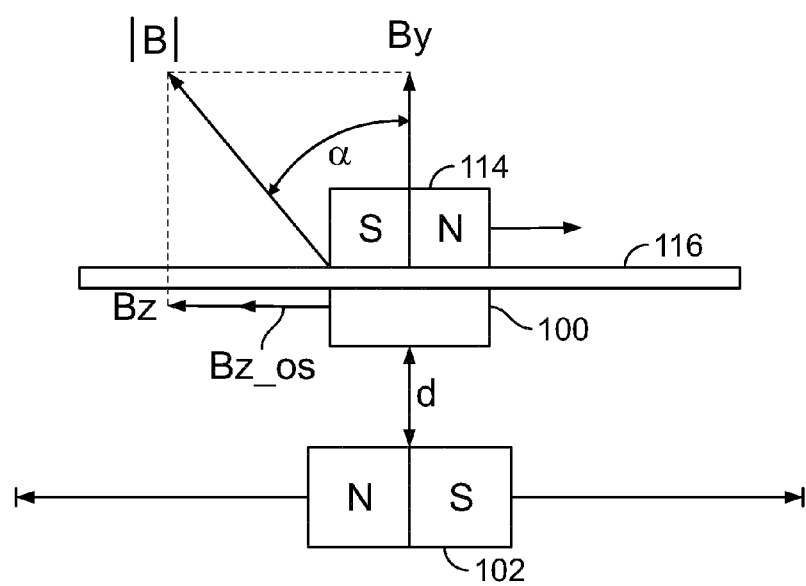
FIG. 14 shows a displacement sensor arrangement according to a fourth embodiment.

Alternatively, however, the auxiliary magnet 114 may also be mounted on the rear side of a circuit carrier, for example, a printed circuit board, PCB, 116, on the other side of which the Hall sensor 100 is constructed. This embodiment is schematically indicated in FIG. 14.

The hardware solution using an auxiliary magnet 114 has the advantage that the calculation provision may be carried out in an unchanged state according to equation (1) but nevertheless the improved level of precision is achieved.

Figure 15:
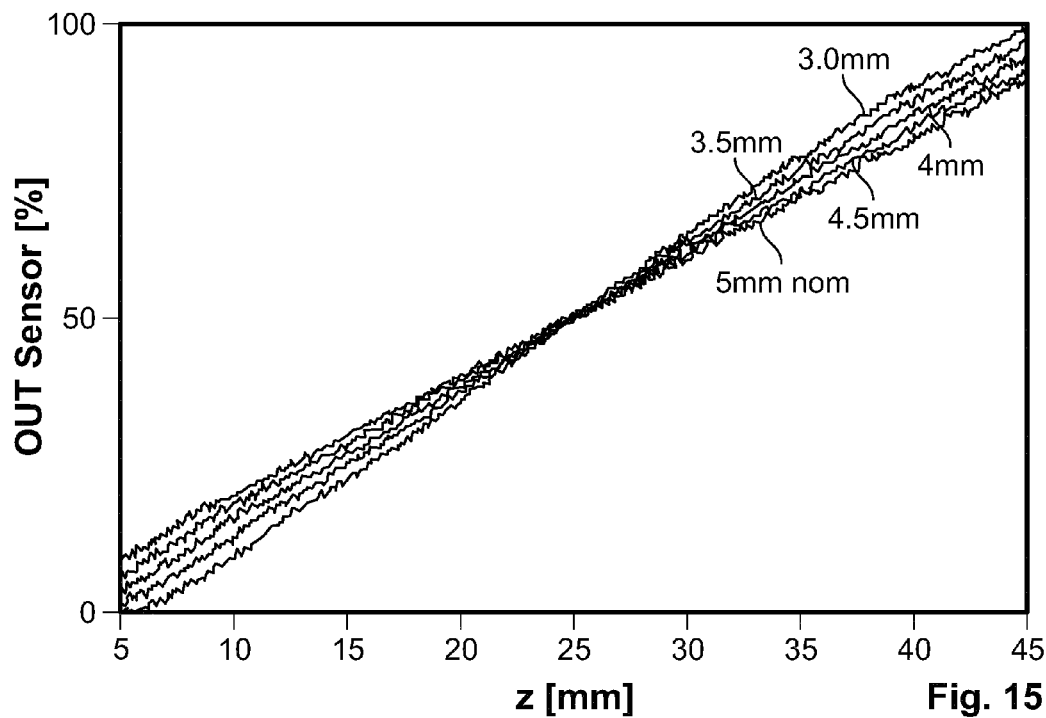
FIG. 15 is an illustration of the characteristic lines for a variation in spacing between the magnet and the sensor for the conventional calculation provisions.
Figure 16:
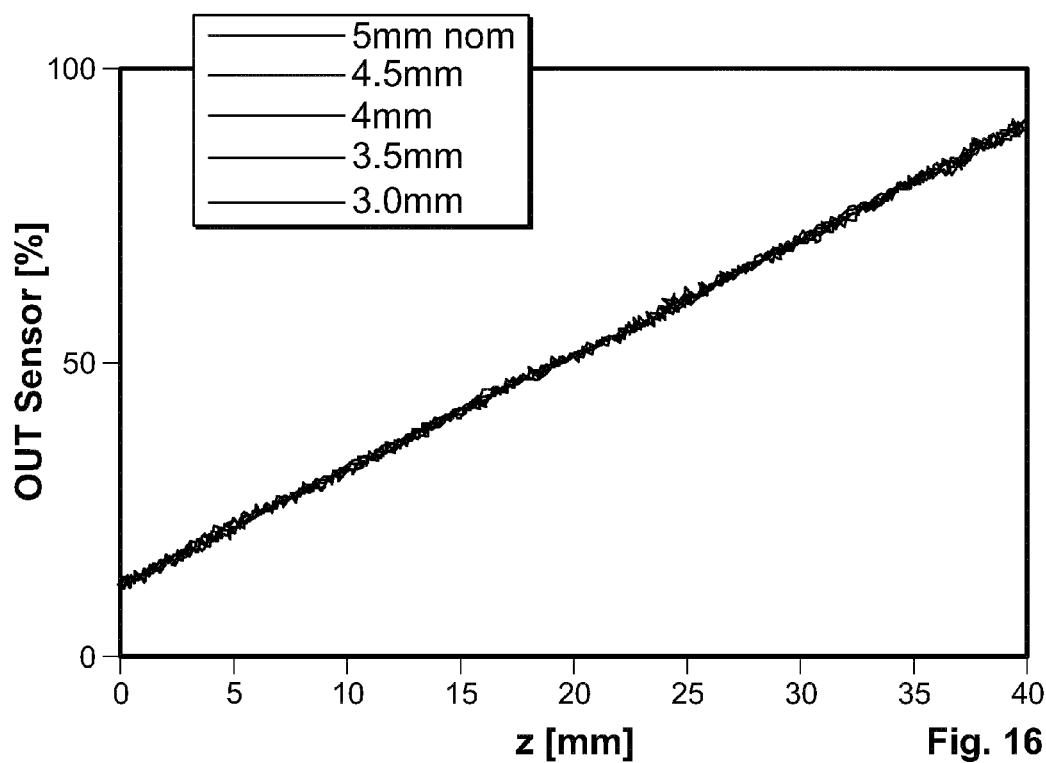
FIG. 16 shows the path of the characteristic lines for the arrangement according to FIG. 1 when the correction according to the invention is used.

The advantageous effect of the solution according to the invention can be shown directly by a comparison of FIGS. 15 and 16.

FIG. 15 shows the output signal of the sensor in accordance with the displacement of the permanent magnet for different distances d between the magnet and the sensor as a parameter. The different gradient values in accordance with the variation in spacing can clearly be seen. If, however, the value of the difference between the maximum of the corresponding magnetic field component and the value at the point of inflection is calculated as above with reference to FIG. 11, an offset of 14.7 mT is obtained. If the value corrected by the value 14.7 mT is used in place of the uncorrected magnetic field component for the arc tangent calculation, the group of lines of FIG. 16 is produced in comparison with the group of characteristic lines of FIG. 15 which are greatly dependent on spacing.

In the case of a variation in the spacing d, no deviation of the characteristic line in accordance with the spacing d between the permanent magnet and the Hall sensor as a parameter can be established at all any longer in FIG. 16 and the gradient error can no longer be detected with respect to the measurement noise.

| REFERENCE NUMERALS | |
|---|---|
| 100 | Hall sensor |
| 102 | Permanent magnet |
| 104 | Line progression α_lin |
| 106 | Line progression α_7.0 mm - α_6.5 mm |
| 108 | Line progression α_6.5 mm - α_5.5 mm |
| 110 | Line progression Bz + OS |
| 112 | Line progression α_OS |
| 114 | Auxiliary magnet |
| 116 | Circuit carrier (PCB) |
| 118 | Line progression α_OS_7.0 mm - α_OS_6.5 mm |
| 120 | Line progression α_OS_6.5 mm - α_OS_5.5 mm |

The invention claimed is:

1. A method for contactless measurement of a relative position of a magnetic field source, which produces a magnetic field, and a magnetic field sensor in relation to each other, wherein:
   the magnetic field source and the magnetic field sensor being movable by a linear movement relative to each other;
   the magnetic field sensor detecting at least two spatial components of the magnetic field, one magnetic field component which extends in a movement direction between the magnetic field source and the magnetic field sensor, and one magnetic field component which extends transversely to the relative movement direction, and a position signal being produced from the magnetic field components and the method comprising the following steps:
      calculating the position signal based on a quotient of the two magnetic field components; and
      correcting, before the quotient is calculated, the magnetic field component which extends in the movement direction between the magnetic field source and the magnetic field sensor, wherein an offset value for correction is established by the following steps:

establishing a line of the magnetic field component in the movement direction in accordance with a position value;

calculating a second derivative of the line according to the position value and establishing a zero position of the second derivative; and subtracting a function value of the line at the zero position from a function value of the line at a position of minimum spacing in order to calculate the offset value for correction.

2. The method according to claim 1, wherein the magnetic field sensor is comprised of a two-dimensional or three-dimensional Hall sensor.

3. The method according to claim 1, wherein the magnetic field source is comprised of at least one permanent magnet.

4. The method according claim 1, wherein the offset value for correction is a constant offset value, and correcting comprises adding the constant offset value to the magnetic field component which extends in the movement direction between the magnetic field source and the magnetic field sensor.

5. The method according to claim 1, wherein correcting comprises superimposing an auxiliary magnetic field produced by an auxiliary magnet over the magnetic field produced by the magnetic field source.

6. A displacement sensor system for contactless measurement of a relative position of a magnetic field source, which produces a magnetic field, and a magnetic field sensor in relation to each other, comprising:

the magnetic field source and the magnetic field sensor, the magnetic field source and the magnetic field sensor being movable by a linear movement relative to each other;

the magnetic field sensor being constructed in such a manner that it detects at least two spatial components of the magnetic field, one magnetic field component which extends in a movement direction between the magnetic field source and the magnetic field sensor, and one magnetic field component which extends transversely to the relative movement direction, and produces a position signal based on a quotient of the two magnetic field components; and the displacement sensor system further having a correction unit, which corrects, before the quotient is calculated, a value of the magnetic field component that extends in the movement direction between the magnetic field source and the magnetic field sensor, wherein an offset value for correction is established by the following steps:

establishing a line of the magnetic field component in the movement direction in accordance with a position value;

calculating a second derivative of the line according to the position value and establishing a zero position of the second derivative; and subtracting a function value of the line at the zero position from a function value of the line at a position of minimum spacing in order to calculate the offset value for correction.

7. The displacement sensor system according to claim 6, wherein the offset value for correction is a constant correction factor, and the correction unit comprising a calculation unit for computationally adding the constant correction factor to the value of the magnetic field component that extends in the movement direction between the magnetic field source and the magnetic field sensor.

8. The displacement sensor system according to claim 6, wherein the correction unit comprises at least one auxiliary magnet whose magnetic field is superimposed on the magnetic field of the magnetic field source in such a manner that the value of the magnetic field component which extends in a movement direction between the magnetic field source and the magnetic field sensor is corrected by a constant correction factor.

9. The displacement sensor system according to claim 8, wherein the at least one auxiliary magnet is arranged so as to be fixed in position relative to the magnetic field sensor.

10. The displacement sensor system according to claim 9, wherein the at least one auxiliary magnet is mounted on a common circuit carrier with the magnetic field sensor.

11. The displacement sensor system according to claim 6, wherein the magnetic field sensor comprises a two-dimensional or three-dimensional Hall sensor.

12. The displacement sensor system according to claim 6, wherein the magnetic field source comprises at least one permanent magnet.

13. The displacement sensor system according to claim 6, wherein the magnetic field source produces a magnetic field, which is rotationally symmetrical with respect to an axis which is defined by relative linear movement between the magnetic field source and the magnetic field sensor.

* * * * *